United States Patent [19]

Lapham et al.

[11] Patent Number: 5,319,227
[45] Date of Patent: Jun. 7, 1994

[54] LOW-LEAKAGE JFET HAVING INCREASED TOP GATE DOPING CONCENTRATION

[75] Inventors: Jerome F. Lapham, Groton; Adrian P. Brokaw, Burlington, both of Mass.

[73] Assignee: Analog Devices, Incorporated, Norwood, Mass.

[21] Appl. No.: 849,963

[22] Filed: Mar. 12, 1992

Related U.S. Application Data

[63] Continuation of Ser. No. 405,566, Sep. 11, 1989, abandoned, which is a continuation of Ser. No. 658,270, Oct. 5, 1984, abandoned.

[51] Int. Cl.$^5$ .............................................. H01L 29/80
[52] U.S. Cl. .................................. 257/270; 257/285; 257/740; 257/751
[58] Field of Search ................ 257/270, 285, 740, 751

[56] References Cited

U.S. PATENT DOCUMENTS 4,107,726 8/1978 Schilling .................... 357/71
4,176,368 11/1979 Compton .................... 357/41
4,456,918 6/1984 Beasom ..................... 357/41

FOREIGN PATENT DOCUMENTS 59-4086 1/1984 Japan ..................... 257/285

Primary Examiner—Robert Limanek
Attorney, Agent, or Firm—Parmelee, Bollinger & Bramblett

[57] ABSTRACT

A low-leakage-current JFET having electrically isolated top and bottom gates. The structure employs enclosed geometry wherein one source/drain region fully surrounds the other source/drain region. Connection to the top gate is made through a diffusion-barrier to prevent penetration of metallization into the top gate contact region. A non-penetrating contact layer is provided on the upper surface of the top gate so that the material of the contact layer does not enter the top gate region to any significant extent. Both the channel region and the shield layer are formed by ion-implantation.

6 Claims, 1 Drawing Sheet

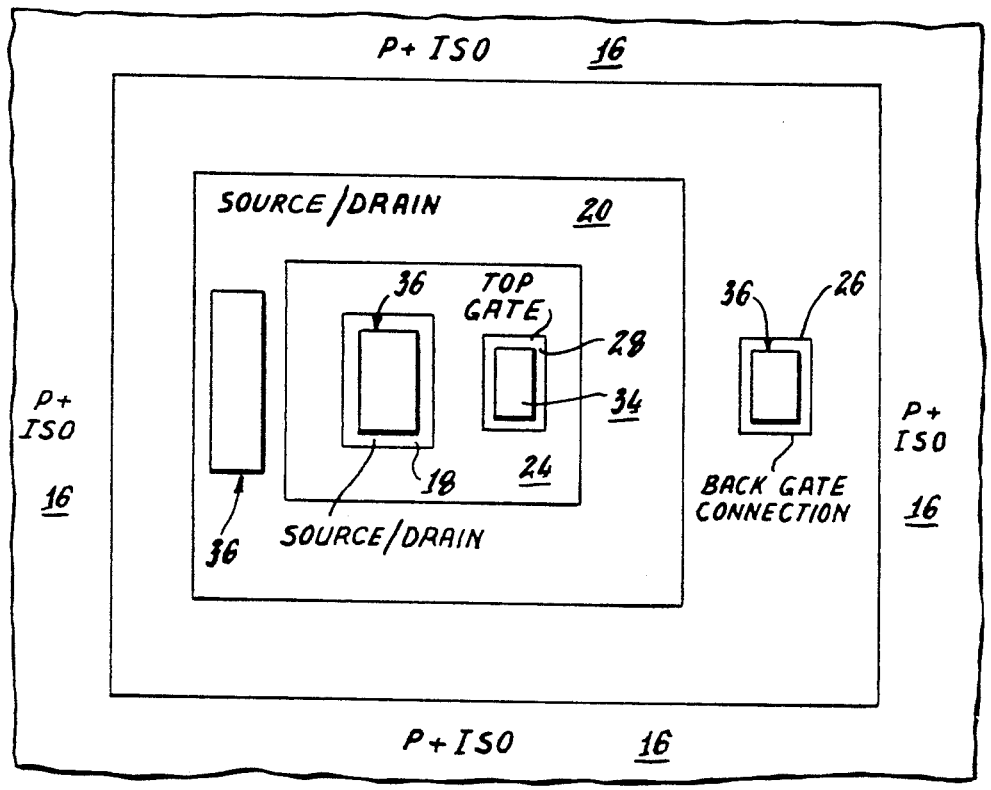
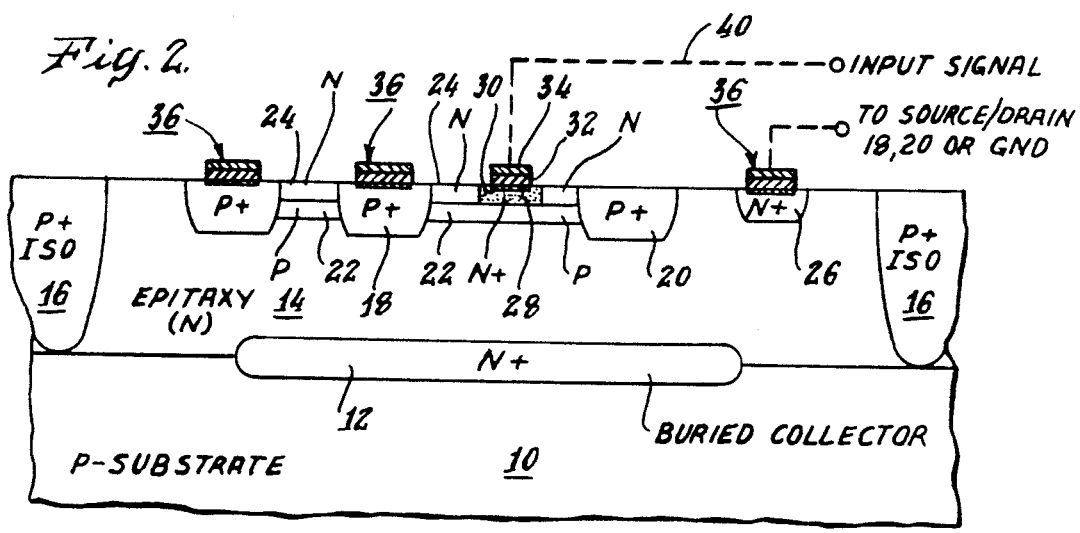

LOW-LEAKAGE JFET HAVING INCREASED TOP GATE DOPING CONCENTRATION

This application is a continuation of application Ser. No. 405,566 filed Sep. 11, 1989 which is a continuation of application Ser. No. 658,270 as originally filed Oct. 5, 1984, now both abandoned.

BACKGROUND OF THE INVENTION

1. Field of the Invention

This invention relates to transistors. More particularly, this invention relates to junction field effect transistors (commonly known as JFETs) formed in integrated-circuit (IC) chips.

2. Description of the Prior Art

Junction field effect transistors have been in use for many years, and generally are considered advantageous because their high input impedance results in quite low current being drawn from the device supplying the input signal, and also because they have relatively low noise. Thus JFETs frequently are employed as the input stage of high-performance amplifiers. In such arrangements, the JFETs generally are integrated on an IC chip with conventional bipolar devices, for example, to form an operational amplifier.

Prior art JFET devices typically are formed in an epitaxial layer often grown over a buried collector diffused in a substrate. The JFET devices include two source/drain regions of conductivity type opposite to that of the epitaxial layer, and are connected by a channel region of that same opposite conductivity type. (The term "source/drain" is used to identify a region which can serve interchangeably either as a source or as a drain, depending upon the characteristics of an associated circuit.) Current flow through the channel is controlled by the potential of a gate region adjacent the channel. In the usual JFET, there will be both a top gate and a back gate, i.e. the regions just above and just below the channel.

The source/drain regions of a JFET ordinarily are formed by standard diffusion techniques. The channel however commonly and advantageously is formed by ion-implantation, in a region which lies a small distance below the surface of the IC chip. Just above the channel implant, there is an even shallower implant of opposite type, i.e. of the same conductivity type as the epitaxy. This latter implant is referred to as the shield layer, and serves to provide an electrostatic image for any charges exterior to the device which might otherwise find an image in the channel and thus affect the current flowing there. Such exterior charge can for example be from static, from sodium in an oxide layer, or from monolayers of polar molecules chemisorbed on the surface of the chip. The shield layer provides stability for the device, and also constitutes the top gate for the JFET channel between the source/drain regions.

The top gate of a JFET device must be electrically connected to some controlled potential, or the device will be electrically unstable. If no such connection is made, the device will behave as though the stabilizing layer were not present. Making connection to the top gate in the normal fashion from above the chip, i.e. directly to the upper surface of the top gate, has however presented a problem due to the extreme shallowness of the shield and channel regions which in turn result from the use of ion-implantation. For example, if the commonly used contact metallurgies such as Aluminum are employed to make such direct connection to the top gate, it will be found that the metal tends to penetrate through the shallow top gate layer to the channel, causing a gate-to-channel short circuit.

To avoid that problem, the top gate conventionally is maintained at a controlled potential by connecting it to the back gate, and by directing the input signal to the back gate, thereby indirectly controlling the potential of the top gate. This top gate-to-back gate connection typically is made by a diffusion which extends from the upper surface of the semi-conductive body down through a small area of the channel region to the epitaxial layer. In such prior art devices, no electrical contact is made to the top gate from above that gate, and the two gates always are connected together.

With the top and back gates connected together as described above, the leakage current of the device will include contributions from both the top and back gates. The total leakage current in such case is relatively large, especially in view of the substantial effective area of the back gate. Such relatively large leakage current has detracted from the performance capabilities of prior art JFETs of the type described hereinabove.

SUMMARY OF THE INVENTION

In accordance with the present invention, a JFET device is provided wherein the top gate is electrically isolated from the bottom gate. Signal connection may in this device be made separately to either or both gates, so that the device may be termed a dual-gate JFET. If only the top gate is used to receive a signal for amplification, the leakage current is significantly less than in prior art single-gate-connection devices, where the top and bottom gates are connected together. For example, in accordance with the present invention, the leakage current may be as low as 0.01 pico-amps. In contrast, the leakage current in a device where the top gate is connected to the back gate may be 1 pico-amps or more, due to the large junction area of the back gate to the substrate and isolation regions.

Another advantage resulting from using only the top gate is that it becomes possible to place many such JFETs in a single isolation pocket in the epitaxial layer, with each JFET operating independently of the others. This is not possible with the prior art single-gate-connection devices described above because all of the back gates would be connected to their respective top gates, and back gates so driven cannot function independently of one another if located in the same pocket.

A still further feature of the present invention is that it becomes possible to handle two separate input signals with a single JFET, one signal being applied to the top gate, and the other to the back gate. Such an arrangement might for example be useful in a mixer circuit or the like.

In a preferred embodiment of the invention, to be described hereinbelow in detail, conductive isolation of the top and back gates is effected by employing enclosed geometry for the source/drain regions. That is, one source/drain region fully surrounds (in a lateral sense) the other source/drain region. The device also advantageously is specially arranged so as to avoid the development of any conductive path from the top gate contact down into the JFET body, i.e. into the channel region, or through the channel region to the bottom gate.

In accordance with one aspect of the disclosed embodiment, connection to the top gate advantageously is made by means which includes a diffusion-barrier to prevent penetration of metallization into the top gate contact region. In accordance with yet another aspect of the disclosed embodiment, a non-penetrating contact layer is provided on the upper surface of the top gate, so that the material of the contact layer does not enter the top gate region to any significant extent.

Other objects, aspects and advantages of the invention will in part be pointed out in, and in part apparent from, the following description of a preferred embodiment considered together with the accompanying drawings.

BRIEF DESCRIPTION OF THE DRAWINGS

FIG. 1 is a pictorial plan view of a JFET in accordance with this invention; and FIG. 2 is a section view taken along line 2—2 of FIG. 1.

DETAILED DESCRIPTION OF A PREFERRED EMBODIMENT

Referring now to both FIGS. 1 and 2, there is shown a conventional P-type substrate 10 having a diffused N+ buried collector 12 and a lightly-doped N-type epitaxial layer 14 grown thereover. The epitaxial layer 14 is formed to provide an isolation pocket in the usual way, with deep P+ isolation diffusions 16 around the JFET area. (Although the described embodiment uses an N-type epitaxial layer, the invention is equally applicable to opposite conductivity materials or to devices fabricated in lightly doped diffused wells.)

A JFET in accordance with the preferred embodiment comprises P+ source/drain regions 18, 20 advantageously formed by diffusing Boron in the epitaxial layer 14 in the usual way. The source/drain regions are arranged with an enclosed geometry, that is, one region 18 is surrounded by the other region 20. A relatively shallow P channel 22, preferably of Boron, is ion-implanted in the region between the two source/drain regions, e.g. at a depth of about 0.5 microns. An even shallower N-type shield layer 24, preferably of Arsenic, is ion-implanted just above the channel 22, at a depth of about 0.1 micron.

This shield layer 24 covers the entire channel region 22, and serves as the top gate for the channel. The epitaxial layer 14 serves as the back gate for the channel. The enclosed geometry of the source/drain regions 18, 20 provides for electrical separation of the top gate (shield 24) from the back gate (epitaxial layer 14). Electrical connection to the back gate is made through an N+ diffusion 26 in accordance with known practice.

The top gate 24 includes an interior contact segment 28 in which additional Arsenic is implanted, in a separate step. The additional implant dose preferably is sufficient to assure a surface concentration of about $10^{19}/cm^3$ or greater of Arsenic in that segment, to insure development of an ohmic contact with a contact layer above the segment, to be described. The surrounding top gate region, i.e. beyond the segment 28, has a peak concentration of about $10^{18}/cm^3$. The additional implant of Arsenic in segment 28 is annealed at relatively low temperature (low from the standpoint of diffusion in Silicon).

Special means are provided for making connection to the top gate contact segment 28. More specifically, there is provided immediately above the contact segment a layer 30 of Platinum-Silicide, which has the characteristic of being conductive yet substantially non-penetrating into the contact segment. This non-penetrating layer may be formed by a process including the steps of growing or depositing an oxide layer over the entire wafer, opening the contact segment area (28) by common photolithographic techniques, sputtering Platinum over the wafer, and then placing the wafer in a furnace at about 600° C.

At this temperature, the Platinum will react with the Silicon in the exposed contact segment area 28 to form the metallic compound layer of Platinum-Silicide 30. The wafer then is immersed in an etch bath such as aqua regia to etch off the unreacted Platinum. This immersion will also take off the Platinum from the oxide coating, where no reaction will take place.

The top gate contact structure further includes a barrier layer 32 which in the preferred embodiment comprises an alloy of Titanium/Tungsten, e.g. about 10% Titanium and 90% Tungsten. Such alloy layer is initally deposited over the entire wafer, and then a layer of Aluminium metallization 34 is deposited over the alloy layer. Conventional etching techniques are thereafter employed to remove the Titanium/Tungsten and Aluminum from all areas except where needed for electrical contact purposes.

The Titanium/Tungsten barrier layer advantageously serves to prevent any significant penetration of the Aluminum metallization into the Platinum-Silicide layer 30, and especially prevents such penetration of the contact segment 28.

In the embodiment disclosed herein, the same multi-layer contact arrangement as described above also is employed for the other electrical connections, i.e. for connections to the source/drain regions 18, 20 and to the back gate 14, as generally indicated in each instance at 36. Thus the process steps for all contact structures are identical and may take place simultaneously. The contact for the back gate 14 may if desired be connected to either source/drain region 18 or 20, or to ground, or some other source of controlled potential. The device input signal is indicated as being connected by a lead 40 from a signal source (not shown) to the top gate contact metallization 34.

A JFET manufactured as described herein will have extremely low top gate leakage current, and will be very quiet in operation. A number of such transistors moreover can be placed in a single isolation pocket with independent top or control gates.

Although a specific preferred embodiment of the invention has been described hereinabove in detail, it is to be understood that this is not intended to be limiting of the invention, but rather is for the purpose of illustrating the principles of the invention. Those skilled in the art will be able to modify the invention in such ways as are adapted to meet the requirements of particular applications. For example, the metallization used may in some cases be other conductive metals such as gold, silver or copper; other barrier layers may in some cases be found effective, and similarly other materials may in certain applications be used in place of Platinum-Silicide for shallow ohmic contacts. Still further modifications may be made without departing from the scope of the invention as set forth in the claims hereof.

What is claimed is:

1. A low-leakage-current JFET comprising:
   a semi-conductor body comprising a lightly-doped region of one conductivity type and having a generally planar top surface;

a first source/drain region of a conductivity type opposite side one conductivity type in the top surface of said body;

a second source/drain region of a conductivity type opposite said one conductivity type in the top surface of said body;

a channel region of conductivity type opposite said one conductivity type extending between said first and second source/drain regions at a shallow depth just below said top surface;

a layer of said one conductivity type above said channel region and serving as the top gate for said JFET;

said lightly-doped region serving as the bottom gate of said JFET;

said bottom gate being conductively isolated from said top gate within said semi-conductor body;

top gate contact means for said top gate having an upper portion connectible to terminal means to convey electrical signals to said top gate;

said top gate contact means comprising a non-penetrating contact layer over at least a portion of said top gate;

said top gate comprising at least in a section thereof beneath said non-penetrating contact layer a surface concentration of impurity of said one conductivity type of at least about $1 \times 10^{19}/cm^3$ and sufficient to insure development of an ohmic contact with said non-penetrating contact layer.

2. A low-leakage-current JFET comprising:

a semi-conductor body comprising a lightly-doped region of one conductivity type and having a generally planar top surface;

a first source/drain region of a conductivity type opposite said one conductivity type in the top surface of said body;

a second source/drain region of a conductivity type opposite said one conductivity type in the top surface of said body;

a channel region of conductivity type opposite said one conductivity type extending between said first and second source/drain regions at a shallow depth just below said top surface;

a layer of said one conductivity type above said channel region and serving as the top gate for said JFET;

said lightly-doped region serving as the bottom gate of said JFET;

said bottom gate being conductively isolated from said top gage within said semi-conductor body;

top gate contact means for said top gate having an upper portion connectible to terminal means to convey electrical signals to said top gate;

said top gate contact means comprising a non-penetrating contact layer over a portion of said top gate;

said top gate contact means further comprising an interior contact segment in said top gate portion comprising impurity of said one conductivity type of concentration sufficient to insure development of an ohmic contact with said non-penetrating contact layer;

said top gate having, in the part thereof laterally surrounding said interior contact segment, a concentration which is less than that of said interior contact segment and insufficient to establish an ohmic contact with metallization laid thereon;

said top gate contact means being formed to avoid conductive electrical connection from said upper portion thereof through said channel region to said lightly-doped region.

3. A device as in claim 2, wherein the concentration of said impurity in said interior contact segment is at least about $1 \times 10^{19}/cm^3$.

4. A low-leakage-current JFET comprising:

a semi-conductor body comprising a lightly-doped region of one conductivity type and having a generally planar top surface;

a first source/drain region of a conductivity type opposite said one conductivity type in the top surface of said body;

a second source/drain region of a conductivity type opposite said one conductivity type in the top surface of said body;

a channel region of conductivity type opposite said one conductivity type extending between said first and second source/drain regions at a shallow depth just below said top surface;

a layer of said one conductivity type above said channel region and serving as the top gate for said JFET;

said lightly-doped region serving as the bottom gate of said JFET;

said bottom gate being conductively isolated from said top gate within said semi-conductor body;

top gate contact means for said top gate having an upper metallization portion connectible to terminal means to convey electrical signals to said top gate;

said top gate contact means comprising a non-penetrating contact layer over at least a portion of said top gate and including means to prevent penetration of any of said metallization portion through said top gate;

said top gate comprising at least in a section thereof beneath said non-penetrating contact layer a surface concentration of impurity of said one conductivity type of at least about $1 \times 10^{19}/cm^3$ and sufficient to insure development of an ohmic contact with said non-penetrating contact layer.

5. A JFET as claimed in claim 4, wherein said top gate contact means includes a barrier layer to aid in restricting penetration of said metallization into said top gate.

6. A JFET as claimed in claim 5, wherein said barrier layer is an alloy of Titanium/Tungsten.

* * * * *

UNITED STATES PATENT AND TRADEMARK OFFICE
CERTIFICATE OF CORRECTION

PATENT NO. : 5,319,227
DATED      : June 7, 1994
INVENTOR(S): Jerome F. Lapham and Adrian P. Brokaw It is certified that error appears in the above-identified patent and that said Letters Patent is hereby corrected as shown below:

On the Title Page:

Insert the following:

--Notice: The portion of the term of this patent subsequent to January 15, 2008 has been disclaimed.--

Signed and Sealed this

Fourth Day of October, 1994

Attest:

BRUCE LEHMAN

Attesting Officer

Commissioner of Patents and Trademarks